United States Patent
Lv et al.

(10) Patent No.: US 12,356,799 B2
(45) Date of Patent: Jul. 8, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Lei Lv, Hubei (CN); Meng Jin, Hubei (CN); Tao Yuan, Hubei (CN); Jinchang Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 721 days.

(21) Appl. No.: 17/439,771

(22) PCT Filed: Aug. 3, 2021

(86) PCT No.: PCT/CN2021/110350
§ 371 (c)(1),
(2) Date: Sep. 15, 2021

(87) PCT Pub. No.: WO2023/000381
PCT Pub. Date: Jan. 26, 2023

(65) Prior Publication Data
US 2023/0026941 A1    Jan. 26, 2023

(30) Foreign Application Priority Data
Jul. 20, 2021   (CN) .......................... 202110819247.6

(51) Int. Cl.
*H10K 50/822*   (2023.01)
*H10K 50/844*   (2023.01)
(Continued)

(52) U.S. Cl.
CPC ......... *H10K 59/121* (2023.02); *H10K 50/822* (2023.02); *H10K 50/844* (2023.02);
(Continued)

(58) Field of Classification Search
CPC .. H10K 50/822; H10K 50/844; H10K 50/865; H10K 59/122; H10K 59/38; H10K 59/65; H10K 59/80521; H10K 59/121
See application file for complete search history.

(56) References Cited

U.S. PATENT DOCUMENTS

2016/0049612 A1* 2/2016 Kim ...................... H10K 59/35
                                                              257/88
2016/0240811 A1   8/2016 Kim et al.
(Continued)

FOREIGN PATENT DOCUMENTS

CN       110970480 A    4/2020
CN       111312792 A    6/2020
(Continued)

OTHER PUBLICATIONS

Kuo et al., European Polymer Journal 45 (2009) 474-484 (Year: 2009).*

*Primary Examiner* — Kretelia Graham
*Assistant Examiner* — Jaesun Lee
(74) *Attorney, Agent, or Firm* — PV IP PC; Wei Te Chung

(57) ABSTRACT

The present application provides a display panel and a display device. The display panel includes: a cathode inhibition layer disposed on a side of the pixel definition layer and between light-emitting units, a cathode disposed on a side of a light-emitting layer away from a substrate, and a color filter layer disposed on the cathode away from the substrate, wherein a thickness of the cathode on the cathode inhibition layer is less than a thickness of the cathode on the (Continued)

light-emitting unit. A light shielding portion of the color filter layer includes a light-permeable aperture configured corresponding to the cathode inhibition layer, and a light transmittance of a light-permeable material in the light-permeable aperture is greater than a light transmittance of the light shielding portion.

18 Claims, 3 Drawing Sheets

(51) Int. Cl.
*H10K 50/86* (2023.01)
*H10K 59/121* (2023.01)
*H10K 59/122* (2023.01)
*H10K 59/38* (2023.01)
*H10K 59/65* (2023.01)
*H10K 59/80* (2023.01)

(52) U.S. Cl.
CPC ......... *H10K 50/865* (2023.02); *H10K 59/122* (2023.02); *H10K 59/38* (2023.02); *H10K 59/80521* (2023.02); *H10K 59/65* (2023.02); *H10K 59/873* (2023.02)

(56) References Cited

U.S. PATENT DOCUMENTS

| | | | | |
|---|---|---|---|---|
| 2017/0338284 | A1* | 11/2017 | Tang | H10K 59/35 |
| 2019/0341565 | A1* | 11/2019 | Li | H10K 50/844 |
| 2020/0111964 | A1* | 4/2020 | Nishide | C07D 333/76 |
| 2021/0020622 | A1* | 1/2021 | Wang | H10K 50/828 |
| 2021/0216743 | A1* | 7/2021 | Liu | G06V 40/1318 |
| 2021/0217995 | A1* | 7/2021 | Wang | H10K 59/12 |

FOREIGN PATENT DOCUMENTS

| | | | | |
|---|---|---|---|---|
| CN | 111668388 A | | 9/2020 | |
| CN | 111785742 A | | 10/2020 | |
| CN | 111834547 A | * | 10/2020 | ............... G03F 1/80 |
| CN | 112379794 A | | 2/2021 | |
| CN | 112687727 A | | 4/2021 | |
| CN | 112861763 A | | 5/2021 | |
| CN | 113035921 A | | 6/2021 | |
| CN | 113053978 A | | 6/2021 | |
| CN | 113054133 A | | 6/2021 | |
| CN | 113054134 A | | 6/2021 | |
| CN | 113113454 A | | 7/2021 | |
| CN | 114171571 A | * | 3/2022 | ........... H10K 50/865 |

* cited by examiner

DISPLAY PANEL AND DISPLAY DEVICE

RELATED APPLICATIONS

This application claims the priority benefits of China application serial no. 202110819247.6, which is filed to the China National Intellectual Property Administration on Jul. 20, 2021, and entitled "Display Panel and Display Device", the entire content of which is incorporated into this application by reference.

FIELD OF INVENTION

This application relates to the fields of display technologies, and in particular to display panels and display devices thereof.

BACKGROUND OF INVENTION

Organic light emitting diode (OLED) display technologies receive more and more attention from researchers and are widely used in display fields, such as cell phones, tablets and televisions, etc. With the rapid development of display devices, users' requirements for the screen-to-body ratio of display devices are getting higher and higher, so that large size and high resolution full-screen display devices become the future development direction.

In the conventional art, in order to increase the screen-to-body ratio as much as possible, optical components, such as a front camera and facial recognition, are usually arranged under the screen. However, in existing OLED full-screen display devices, a cathode is configured in an entirety surface, and the cathode has a low transmittance for light. As a result, the optical components arranged under the screen cannot receive sufficient light signals, which affects the normal operations of the optical components. In addition, the polarizer placed above the OLED devices has a light transmittance of only 40% for visible light, which further limits external optical signals captured by the under-screen optical sensors.

Technical Problem

The current OLED display devices have the technical problem of poor light transmittance and cannot meet the light-gathering requirement of the under-screen optical components.

SUMMARY OF INVENTION

Technical Solutions

The present application provides a display panel and a display device thereof, which are used to improve the technical problem of poor light transmittance existing in conventional OLED devices.

The present application provides a display panel, including a normal display area and a functional display area, wherein the display panel includes:
 a substrate, including a pixel definition layer defining a plurality of openings;
 a light-emitting layer disposed on a side of the substrate, the light-emitting layer including a plurality of light-emitting units corresponding to the openings;
 a cathode inhibition layer disposed on a side of the pixel definition layer, at least configured in the functional display area, and disposed between the light-emitting units;
 a cathode disposed on a side of the light-emitting layer away from the substrate, wherein a thickness of the cathode on the cathode inhibition layer is less than a thickness of the cathode on the light-emitting units; and
 a color filter layer disposed on a side of the cathode away from the substrate, the color filter layer including a plurality of color resists corresponding to the light-emitting units, and a light shielding portion configured between adjacent two of the color resists, the light shielding portion including a light-permeable aperture configured corresponding to the cathode inhibition layer, the light-permeable aperture filled with a light-permeable material, wherein a light transmittance of the light-permeable material is greater than a light transmittance of the light shielding portion.

In the display panel of the present application, the cathode inhibition layer includes a plurality of cathode inhibition portions disposed between the light-emitting units, and
 an orthographic projection area of light-permeable aperture projected on the cathode inhibition layer is greater than or equal to an area of the cathode inhibition portion.

In the display panel of the present application, an orthographic projection shape of the light-permeable aperture projected on the cathode inhibition layer is same as a shape of a corresponding cathode inhibition portion.

In the display panel of the present application, a distance between the orthographic projection of the light-permeable aperture projected on the light-emitting layer and an adjacent light-emitting unit ranges from 2 micrometers to 10 micrometers.

In the display panel of the present application, an aperture size of the light-permeable aperture at a side close to the cathode inhibition layer is smaller than an aperture size of the light-permeable aperture at a side away from the cathode inhibition layer.

In the display panel of the present application, the aperture size of the light-permeable aperture is gradually decreased from being far away the cathode inhibition layer to close to the cathode inhibition layer.

In the display panel of the present application, a refractive index of the light-permeable material is greater than a refractive index of the light shielding portion.

In the display panel of the present application, an angle between a side surface of the light-permeable aperture and a plane where the color filter layer is located is greater than or equal to 30 degrees and less than 90 degrees.

In the display panel of the present application, the color resist includes a red color resist, a green color resist and a blue color resist, and the light shielding portion includes a black color resist.

In the display panel of the present application, the color resist includes a red color resist, a green color resist, and a blue color resist, and the light shielding portion includes a blue color resist.

In the display panel of the present application, a thickness of the cathode on the cathode inhibition layer is zero.

In the display panel of the present application, a pixel density in the functional display area is less than or equal to a pixel density in the normal display area.

In the display panel of the present application, an area ratio of the cathode inhibition layer in the functional display area ranges 5% to 95%.

In the display panel of the present application, each of the light-emitting units includes: an anode exposed through one of the openings, and a light-emitting function layer provided in the opening and in contact with the anode.

In the display panel of the present application, the display panel further includes a thin-film encapsulation layer disposed between the color filter layer and the cathode.

In the display panel of the present application, an orthographic projection shape of the light-permeable aperture projected on the cathode inhibition layer includes a shape of a circle, a rectangle, and a square.

In the display panel of the present application, the substrate further includes: a base substrate, a semiconductor layer disposed on the base substrate, a gate insulating layer covering the semiconductor layer, a gate electrode disposed on the gate insulating layer, an interlayer insulating layer covering the gate electrode, a source electrode and a drain electrode disposed on the interlayer insulating layer, a planar layer covering the source electrode and the drain electrode, and the pixel definition layer disposed on the planar layer.

In the display panel of the present application, the cathode includes a non-entire surface covering type electrode.

The present application further provides a display panel, including: a normal display area and a functional display area,
wherein the display panel includes:
a substrate, including a pixel definition layer defining a plurality of openings;
a light-emitting layer disposed on a side of the substrate, the light-emitting layer including a plurality of light-emitting units corresponding to the openings;
a cathode inhibition layer disposed on a side of the pixel definition layer, at least configured in the functional display area, and disposed between the light-emitting units;
a cathode disposed on a side of the light-emitting layer away from the substrate, wherein a thickness of the cathode on the cathode inhibition layer is less than a thickness of the cathode on the light-emitting units; and
a color filter layer disposed on a side of the cathode away from the substrate, the color filter layer including a plurality of color resists corresponding to the light-emitting units, and a light shielding portion configured between two adjacent of the color resists, the light shielding portion including a light-permeable aperture configured corresponding to the cathode inhibition layer, the light-permeable aperture filled with a light-permeable material, wherein a light transmittance of the light-permeable material is greater than a light transmittance of the light shielding portion;
the color resist including a red resist, a green resist, and a blue resist, the light shielding portion including a blue resist, and a refractive index of the light-permeable material is greater than a refractive index of the light shielding portion.

The present application further provides a display device, including above-mentioned display panel, and an optical component arranged corresponding to the functional display area of the display panel.

Beneficial Effect

The present application provides a display panel and a display device. The display panel includes: a cathode inhibition layer disposed on a side of the pixel definition layer and between light-emitting units, a cathode disposed on a side of a light-emitting layer away from a substrate, and a color filter layer disposed on the cathode away from the substrate, wherein a thickness of the cathode on the cathode inhibition layer is less than a thickness of the cathode on the light-emitting unit. The color filter layer includes a plurality of color resists corresponding to the light-emitting units, and a light shielding portion configured between two adjacent of the color resists, and the light shielding portion of the color filter layer includes a light-permeable aperture configured corresponding to the cathode inhibition layer, the light-permeable aperture filled with a light-permeable material, and a light transmittance of the light-permeable material in the light-permeable aperture is greater than a light transmittance of the light shielding portion. This present application increases the light transmittance in the area by providing the cathode inhibition layer between the light-emitting units to reduce the cathode thickness in the area. Moreover, a light-permeable aperture corresponding to the cathode inhibition layer is provided on the light shielding portion, and the light-permeable aperture is filled with a light-permeable material to further increase the light transmittance in the area between the light-emitting units, which increases the amount of light captured by the under-screen optical component and is conducive to improving the performance of the under-screen optical component.

DRAWINGS

In order to more clearly explain the embodiments or the technical solutions in the conventional art, the following will briefly introduce the drawings that need to be used in the description of the embodiments or the conventional art. It is apparent that the drawings in the following description are only some embodiments of the application. For those of ordinary skill in the art can obtain other drawings based on these drawings without any creative work.

DETAILED DESCRIPTION OF EMBODIMENTS

Figure 1:
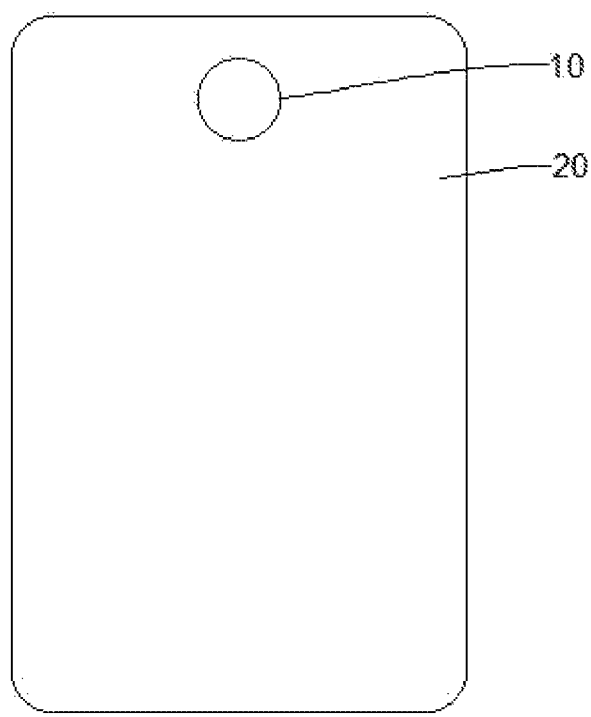
FIG. 1 is a schematic structural view of a display panel provided by an embodiment of the present application.

The description of the following embodiments refers to the attached drawings to illustrate specific embodiments that can be implemented in the present application. The directional terms mentioned in this application, such as "upper", "lower", "front", "rear", "left", "right", "inside", "outside", "side" etc., are merely refer to the direction of the accompanying drawing. Therefore, the directional terms used are used to illustrate and understand the present application, rather than to limit the present application. In the drawings, elements with similar structures are indicated by the same reference numerals.

The embodiments of the present application provides a display panel and a display device. The display panel includes: a cathode inhibition layer disposed on a side of the pixel definition layer and between light-emitting units, a cathode disposed on a side of a light-emitting layer away from a substrate, and a color filter layer disposed on the cathode away from the substrate, wherein a thickness of the cathode on the cathode inhibition layer is less than a thickness of the cathode on the light-emitting unit. The color filter layer includes a plurality of color resists corresponding to the light-emitting units, and a light shielding portion configured between two adjacent of the color resists, and the light shielding portion of the color filter layer includes a light-permeable aperture configured corresponding to the cathode inhibition layer, the light-permeable aperture filled with a light-permeable material, and a light transmittance of the light-permeable material in the light-permeable aperture is greater than a light transmittance of the light shielding portion. The embodiments of the present application increases the light transmittance in the area by providing the cathode inhibition layer between the light-emitting units to reduce the cathode thickness in the area. Moreover, a light-permeable aperture corresponding to the cathode inhibition layer is provided on the light shielding portion, and the light-permeable aperture is filled with a light-permeable material to further increase the light transmittance in the area between the light-emitting units, which increases the amount of light captured by the under-screen optical component and is conducive to improving the performance of the under-screen optical component.

Refer to FIG. 1. FIG. 1 is a schematic structural view of a display panel provided by an embodiment of the present application. The display panel includes a functional display area 10 and a normal display area 20. Both the functional display area 10 and the normal display area 20 have display functions, thereby realizing a full-screen design of the display panel.

The functional display area 10 may be surrounded by the normal display area 20 or may be located at one side of the normal display area 20. The display panel area corresponding to the functional display area 10 may be provided with optical components, such as an under-screen camera, an under-screen optical sensor, and the like. A light transmittance of the functional display area 10 is greater than a light transmittance of the normal display area 20 to meet the light-gathering requirement of the optical components under the screen.

In order to realize the display function of the functional display area 10, a plurality of pixel units are arranged in the functional display area 10. The pixel units in the functional display area 10 and the pixel units in the normal display area 20 may be same or different. A pixel density in the functional display area 10 is less than or equal to a pixel density in the normal display area 20.

Figure 2:
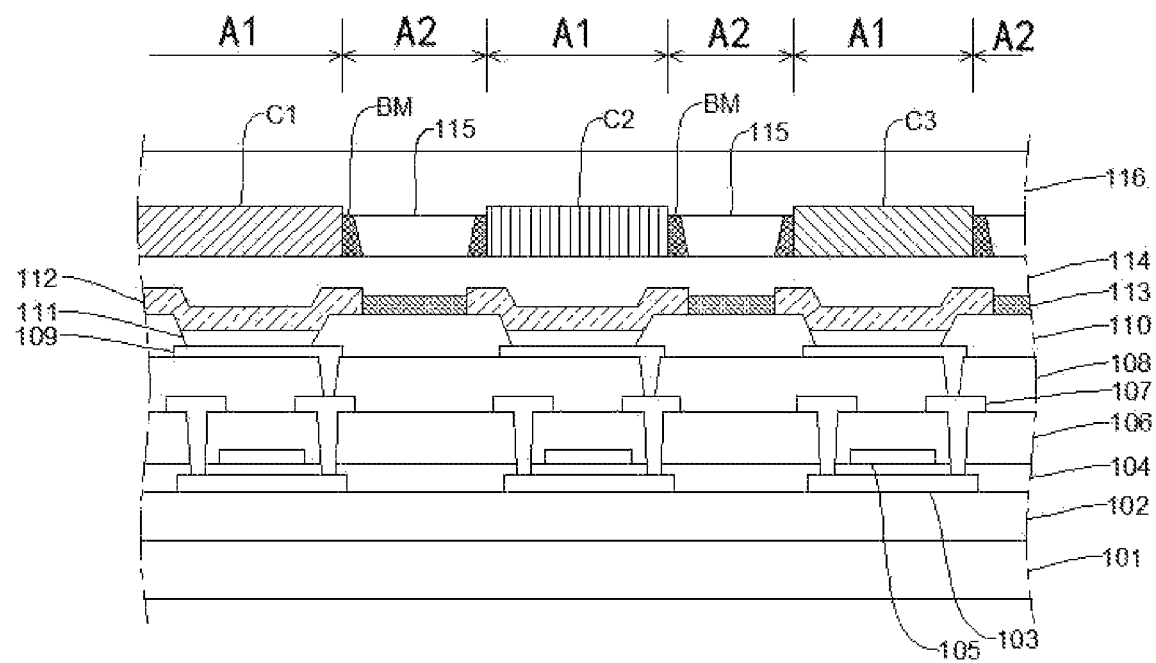
FIG. 2 is a schematic view of a first film structure of a functional display area of the display panel shown in FIG. 1.

Refer to FIG. 2. FIG. 2 is a schematic view of a first film structure of a functional display area of the display panel shown in FIG. 1.

In the functional display area 10, the display panel includes a plurality of light-emitting areas A1 and a plurality of light-transmitting areas A2. The light-emitting areas A1 and the light-transmitting areas A2 are alternately distributed in the functional display area 10 to ensure that an entire of the functional display areas 10 has an uniform image display quality and uniform light transmittance. In which, the light-emitting areas A1 are areas corresponding to each of the light-emitting units of the display panel, and the light-transmitting areas A2 are areas corresponding areas between individual light-emitting units of the display panel.

Optionally, an area proportion occupied by the light-transmitting areas A2 in the functional display area 10 ranges from 5% to 95%. By adjusting the size of each of the light-transmitting areas A2, the total area of the light-transmitting areas in the functional display area 10 can be adjusted to meet the light-gathering requirement of the different under-screen optical components.

Specifically, the display panel includes a substrate, and the substrate may include: a base substrate 101, a buffer layer 102 disposed on the base substrate 101, a semiconductor layer 103 disposed on the buffer layer 102, a gate insulating layer 104 covering the semiconductor layer 103, a gate electrode 105 disposed on the gate insulating layer 104, an interlayer insulating layer 106 covering the gate electrode 105, a source electrode and a drain electrode 107 disposed on the interlayer insulating layer 106, a planar layer 108 covering the source electrode and the drain electrode 107, and a pixel definition layer 110 disposed on the planar layer 108, the pixel definition layer 110 defining a plurality of openings, the openings corresponding to the positions of the light-emitting areas A1.

The base substrate 101 may be a composite structure composed of a first polyimide layer, an intermediate buffer layer and a second polyimide layer. The source electrode and the drain electrode 107 are connected to opposite ends of the semiconductor layer 103 through via holes of the gate insulating layer 104 and the interlayer insulating layer 106, and the semiconductor layer 103, the gate electrode 105, the source electrode and the drain electrode 107 constitute a thin film transistor device.

Furthermore, the display panel further includes a light-emitting layer disposed on one side of the substrate, the light-emitting layer includes a plurality of light-emitting units disposed corresponding to the openings on the pixel definition layer 110, and each of the light-emitting units includes: an anode 109 disposed on the planar layer 108 and exposed through the opening, and a light-emitting function layer 111 disposed in the opening and in contact with the anode 109, the anode 109 electrically connected to the source electrode and the drain electrode 107 through a via passing through the planar layer 108 and receiving light-emitting driving signals transmitted by the source electrode and the drain electrode 107.

Further, the display panel further includes a cathode inhibition layer 113 disposed on one side of the pixel definition layer 110, and the cathode inhibition layer 113 is at least configured in the functional display area 10, is disposed between the light-emitting units, and corresponds to the light-transmitting area A2.

The display panel further includes a cathode 112 disposed on a side of the light-emitting layer away from the substrate, wherein a thickness of the cathode 112 on the cathode inhibition layer 113 is less than a thickness of the cathode 112 on the light-emitting layer.

The cathode inhibition layer 113 is correspondingly configured in the light-transmitting area A2, and is staggered from the light-emitting area A1. The cathode inhibition layer 113 is used to reduce a deposition thickness of the cathode 112 in the light-transmitting area A2, so as to increase the light transmittance of the light-transmitting area A2. When an entire surface type of the cathode 112 is fabricated by the deposition process, due to the presence of the cathode inhibition layer 113, molecules of cathode material are not easily deposited in an area where the cathode inhibition layer 113 is located, thereby reducing or completely subtracting a thickness of the cathode in the area where the cathode inhibition layer 113 is located.

Figure 3:
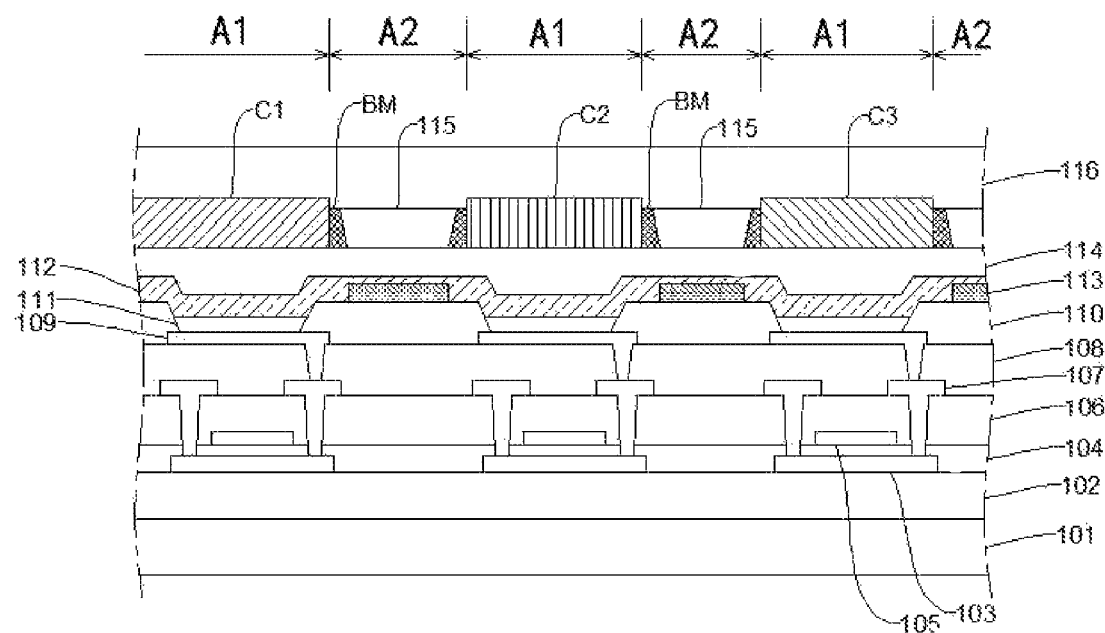
FIG. 3 is a schematic view of a second film structure of the functional display area of the display panel shown in FIG. 1.

Optionally, referring to FIG. 3, FIG. 3 is a schematic view of a second film structure of the functional display area of the display panel shown in FIG. 1. The cathode 112 is an entire surface covering type electrode. The cathode 112 retains a certain thickness on the cathode inhibition layer 113, and a thickness of the cathode 112 on the cathode inhibition layer 113 is less than a thickness of the cathode 112 on the light-emitting areas A1, thereby reducing an influence of the cathode 112 on the light transmittance of the light-transmitting areas A2. An adhesive force between the cathode 112 and the light-emitting units is greater than an adhesive force between the cathode 112 and the cathode inhibition layer 113.

Optionally, referring to FIG. 2, the cathode 112 is a non-entire surface covering type electrode, and the cathode 112 only exists in an area not covered by the cathode inhibition layer 113. That is, a thickness of the cathode 112 on the cathode inhibition layer 113 is zero, thereby eliminating an influence of the cathode 112 on the light transmittance of the light transmitting areas A2, and further improving the light transmitting performance of the functional display areas 10.

Optionally, a minimum distance between the cathode inhibition layer 113 and adjacent one of the light-emitting units ranges from 2 micrometers to 10 micrometers.

Continuing to refer to FIG. 2, the display panel further includes a color filter layer disposed on a side of the cathode 112 away from the substrate, and the color filter layer includes: a plurality of color resists corresponding to the light-emitting units, and a light shielding portion configured between adjacent two of the color resists. The color resists are configured corresponding to the light-emitting areas A1, and the light shielding portion is arranged corresponding to the light-transmitting areas A2.

Optionally, a thin-film encapsulation layer 114 is disposed between the color filter layer and the cathode 112, and an upper substrate 116 is disposed on a side of the color filter layer away from the thin-film encapsulation layer 114.

The color resist includes a red color resist C1, a green color resist C2, and a blue color resist C3, and the light shielding portion is a black light shielding member BM (i.e., black color resist). The black light shielding member BM is used to prevent the light emitted from adjacent two of the light-emitting areas A1 from cross-talk with each other. In which, the light-emitting function layer 111 corresponding to the red color resist C1 emits red light, the light-emitting functional layer 111 corresponding to the green color resist C2 emits green light, and the light-emitting function layer 111 corresponding to the blue color resist C3 emits blue light.

Further, the black light shielding member BM is provided with a light-permeable aperture, the light-permeable aperture is provided corresponding to the cathode inhibition layer 113, the light-permeable aperture is filled with a light-permeable material 115, a light transmittance of the light-permeable material 115 is greater than a light transmittance of the black light shielding member BM. In this embodiment, by opening the light-permeable aperture corresponding to the cathode inhibition layer 113 on the black light shielding member Bm, and filling the light-permeable aperture with the light-permeable material 115, the light transmitting performance of the light-transmitting area of the display panel is further improved.

Further, the cathode inhibition layer 113 includes a plurality of cathode inhibition portions disposed between the light-emitting units, and an orthographic projection area of light-permeable aperture projected on the cathode inhibition layer 113 is greater than or equal to an area of the cathode inhibition portion. Therefore, it is ensured that at least part of the external light passing through the light-permeable aperture is emitted to an inside of the display panel through the cathode inhibition portions, and the light-transmitting property of the light-transmitting areas A2 is improved.

Furthermore, an orthographic projection shape of the light-permeable aperture projected on the cathode inhibition layer 113 is same as a shape of a corresponding cathode inhibition portion, so as to give full play to the light transmittance of the light-permeable aperture and ensure that the light-transmitting areas A2 have better light-transmitting capability. Optionally, wherein an orthographic projection shape of the light-permeable aperture projected on the cathode inhibition layer 113 includes a shape of a circle, a rectangle, a square, or other regular or irregular polygon.

Further, a distance between the orthographic projection of the light-permeable aperture projected on the light-emitting layer and adjacent one of the light-emitting units ranges from 2 micrometers to 10 micrometers (for example: 4 micrometers, 5 micrometers, 6 micrometers, 8 micrometers, etc.), which can not only enhance the light-gathering effect of the cathode patterned area and the light transmittance, but also prevent the light emitted by the light-emitting units from being transmitted through the light-permeable aperture and causing a poor display.

Further, an aperture size of the light-permeable aperture at a side close to the cathode inhibition layer 113 is smaller than an aperture size of the light-permeable aperture at a side away from the cathode inhibition layer 113. That is, the aperture size of the light-permeable aperture is gradually decreased from being away from the cathode inhibition layer 113 to close to the cathode inhibition layer, thereby forming a trapezoidal opening. Specifically, an angle between a side surface of the light-permeable aperture and a plane where the color filter layer is located is greater than or equal to 30 degrees and less than 90 degrees (for example, 45 degrees, 60 degrees, 75 degrees, 80 degrees, etc.). The light-permeable apertures with the trapezoidal openings can increase light entering the light-transmitting areas A2 from the outside environment, thereby further improving the light-transmitting performance of the light-transmitting areas A2.

Figure 4:
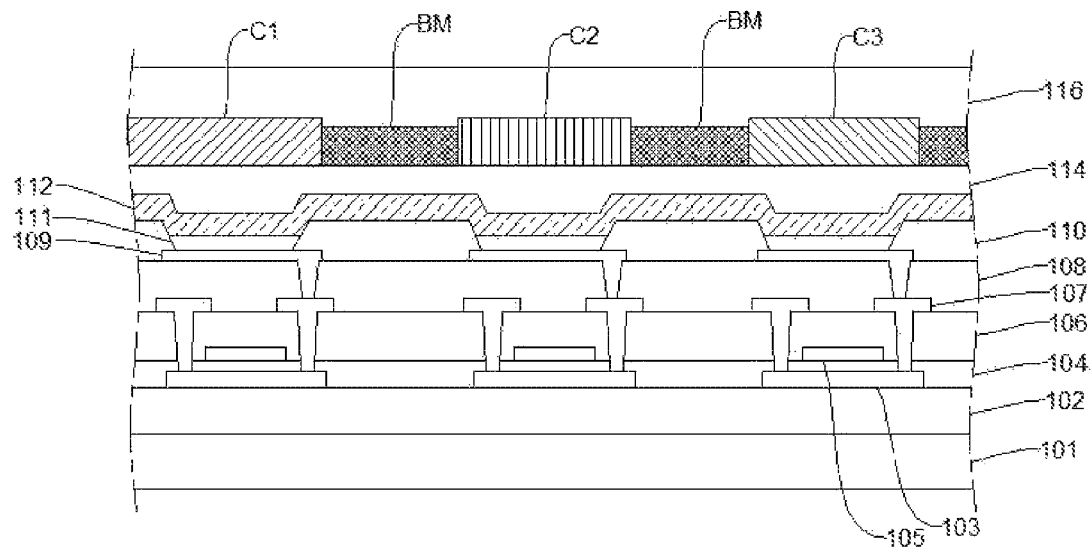
FIG. 4 is a schematic view of a film structure of a normal display area of the display panel shown in FIG. 1.

Referring to FIG. 4, FIG. 4 is a schematic view of a film structure of a normal display area of the display panel shown in FIG. 1.

In the normal display area 20, the display panel includes: a base substrate 101, a buffer layer 102 disposed on the base substrate 101, a semiconductor layer 103 disposed on the buffer layer 102, a gate insulating layer 104 covering the semiconductor layer 103, a gate electrode 105 disposed on the gate insulating layer 104, a interlayer insulating layer 106 covering the gate electrode 105, a source electrode and a drain electrode 107 disposed on the interlayer insulating layer 106, a planar layer 108 covering the source electrode and the drain electrode 107, an anode 109 disposed on the planar layer 108, a pixel definition layer 110 disposed on the planar layer 108 and having an opening corresponding to the anode 109, a light-emitting function layer 111 configured in the opening of the pixel definition layer 110, a cathode 112 disposed on the light-emitting function layer 111 and the pixel definition layer 110, a thin-film encapsulation layer 114 covering the cathode 112, a color resist and a black light shielding member BM disposed on the thin-film encapsulation layer 114, and an upper substrate 116 disposed on the color resist and the black light shielding member BM. The color resist includes a red color resist C1, a green color resist C2, and a blue color resist C3.

Compared with the film structure of the functional display area 10, the film structure of the normal display area 20 does not include a cathode inhibition layer, a light-permeable aperture provided in a black light shielding member, and the light-permeable aperture filled with a light-permeable material.

Further, when the display panel is fabricated, each film layer of the light-emitting function layer 111 is sequentially formed on the anode 109 through a mask evaporation process. Then, the cathode inhibition layer 113 is formed on the pixel definition layer 110 by a fine mask evaporation process. Afterward, the cathode 112 is evaporated on the light-emitting function layer 111 and the cathode inhibition layer 113 through a mask evaporation process. Because the cathode inhibition layer 113 has a function of inhibiting the deposition of cathode materials, the cathode located on the cathode inhibition layer 113 is thinned, or there is no cathode on the cathode inhibition layer 113.

Figure 5:
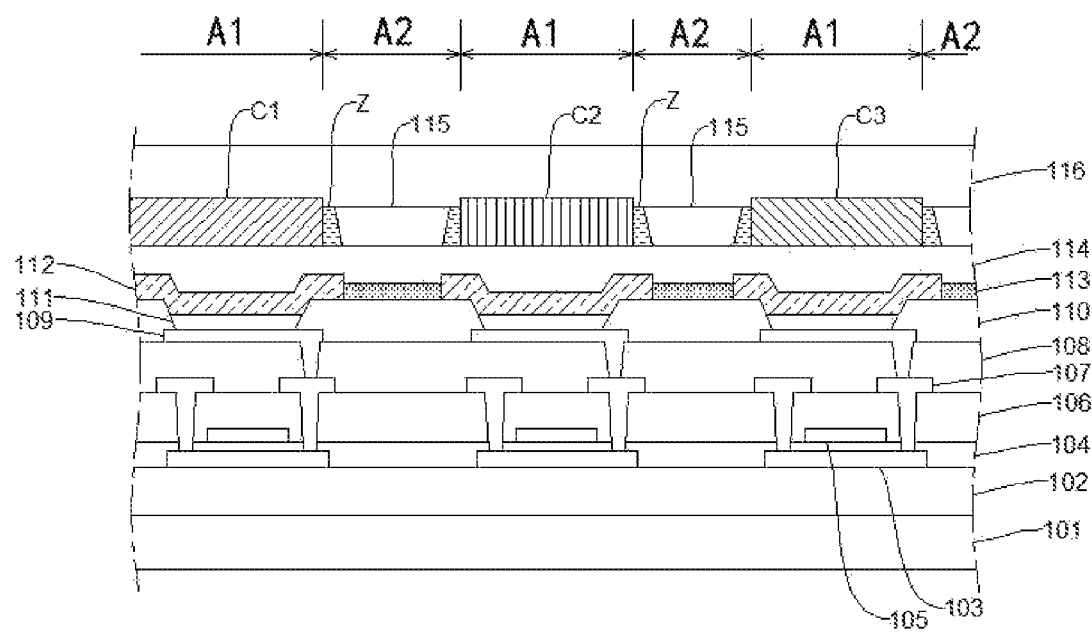
FIG. 5 is a schematic view of a third film structure of the functional display area of the display panel shown in FIG. 1.

In an embodiment, referring to FIG. 5, FIG. 5 is a schematic view of a third film structure of the functional display area of the display panel shown in FIG. 1. In this embodiment, the structural features of the display panel are same as or similar to those of the display panels shown in FIGS. 2 to 4. The structural features of the display panel shown in FIG. 5 are described below, with reference to the description of the above embodiments for those not detailed therein.

The display panel includes a plurality of light-emitting areas A1 and a plurality of light-transmitting areas A2. The light-emitting areas A1 and the light-transmitting areas A2 are alternately distributed in the functional display area 10 to ensure that an entire of the functional display areas 10 has a uniform image display quality and uniform light transmittance. The light-emitting areas A1 are areas corresponding to each of the light-emitting units of the display panel, and the light-transmitting areas A2 are areas corresponding areas between individual light-emitting units of the display panel.

An area proportion occupied by the light-transmitting areas A2 in the functional display area 10 ranges from 5% to 95%. By adjusting the size of each of the light-transmitting areas A2, the total area of the light-transmitting areas in the functional display area 10 can be adjusted to meet the light-gathering requirement of the different under-screen optical components.

Specifically, the display panel includes a substrate, and the substrate may include: a base substrate 101, a buffer layer 102 disposed on the base substrate 101, a semiconductor layer 103 disposed on the buffer layer 102, a gate insulating layer 104 covering the semiconductor layer 103, a gate electrode 105 disposed on the gate insulating layer 104, an interlayer insulating layer 106 covering the gate electrode 105, a source electrode and a drain electrode 107 disposed on the interlayer insulating layer 106, a planar layer 108 covering the source electrode and the drain electrode 107, and a pixel definition layer 110 disposed on the planar layer 108, the pixel definition layer 110 defining a plurality of openings, the openings corresponding to the positions of the light-emitting areas A1.

Furthermore, the display panel further includes a light-emitting layer disposed on one side of the substrate, the light-emitting layer includes a plurality of light-emitting units disposed corresponding to the openings on the pixel definition layer 110, and each of the light-emitting units includes: an anode 109 disposed on the planar layer 108 and exposed through the opening, and a light-emitting function layer 111 disposed in the opening and in contact with the anode 109, the anode 109 electrically connected to the source electrode and the drain electrode 107 through a via passing through the planar layer 108 and receiving light-emitting driving signals transmitted by the source electrode and the drain electrode 107.

Further, the display panel further includes a cathode inhibition layer 113 disposed on one side of the pixel definition layer 110, the cathode inhibition layer 113 at least configured in the functional display area 10, and disposed between the light-emitting units and corresponding to the light-transmitting area A2. The display panel further includes a cathode 112 disposed on a side of the light-emitting layer away from the substrate, wherein a thickness of the cathode 112 on the cathode inhibition layer 113 is less than a thickness of the cathode 112 on the light-emitting layer.

The cathode inhibition layer 113 is correspondingly configured in the light-transmitting area A2, and is staggered from the light-emitting area A1. The cathode inhibition layer 113 is used to reduce a deposition thickness of the cathode 112 in the light-transmitting area A2, so as to increase the light transmittance of the light-transmitting area A2.

Optionally, the cathode 112 is an entire surface covering type electrode, and a thickness of the cathode 112 on the cathode inhibition layer 113 is less than a thickness of the cathode 112 in the light-emitting areas A1. Alternatively, the cathode 112 is a non-entire surface covering type electrode, and the cathode 112 only exists in an area not covered by the cathode inhibition layer 113. That is, a thickness of the cathode 112 on the cathode inhibition layer 113 is zero. The above-mentioned design of this embodiment can improve the light transmittance performance of the display panel.

Optionally, the cathode inhibition layer 113 is distributed in a plurality of segments, and a shape of each cathode inhibition layer 113 may be one or more shapes of a circle, a rectangle, a square, or other regular or irregular polygons.

The display panel further includes a color filter layer disposed on a side of the cathode 112 away from the substrate, and the color filter layer includes: a plurality of color resists corresponding to the light-emitting units, and a light shielding portion configured between adjacent two of the color resists. In which, the color resists are configured corresponding to the light-emitting areas A1, and the light shielding portions Z is arranged corresponding to the light-transmitting areas A2. A thin-film encapsulation layer 114 is disposed between the color filter layer and the cathode 112, and an upper substrate 116 is disposed on a side of the color filter layer away from the thin-film encapsulation layer 114.

The color resist includes a red color resist C1, a green color resist C2, and a blue color resist C3, and the light shielding portions Z may be at least one of a red color resist, a green color resist, and a blue color resist, and is preferably a blue color resist with a darker brightness. The light-emitting function layer 111 corresponding to the red color resist C1 emits red light, the light-emitting functional layer 111 corresponding to the green color resist C2 emits green light, and the light-emitting function layer 111 corresponding to the blue color resist C3 emits blue light.

Further, the light shielding portion Z is provided with a light-permeable aperture, the light-permeable aperture is provided corresponding to the cathode inhibition layer 113, the light-permeable aperture is filled with a light-permeable material 115, a light transmittance of the light-permeable material 115 is greater than a light transmittance of the light shielding portion Z. In this embodiment, by opening the light-permeable aperture corresponding to the cathode inhibition layer 113 on the light shielding portion Z, and filling the light-permeable aperture with the light-permeable material 115, the light transmitting performance of the light-transmitting area of the display panel is further improved.

Optionally, a refractive index of the light-permeable material 115 is greater than a refractive index of the light shielding portion Z. That is, when the light shielding portion Z is a red color resist, the refractive index of the light-permeable material 115 is greater than a refractive index of the red color resist. When the light shielding portion Z is a green color resist, the refractive index of the light-permeable material 115 is greater than a refractive index of the green color resist; when the light shielding portion Z is a blue color resist, the refractive index of the light-permeable material 115 is greater than a refractive index of the blue resist.

By configuring the light-permeable material 115 in the light-permeable aperture, and configuring a refractive index of the light-permeable material 115 being greater than a refractive index of the light shielding portion Z, this embodiment makes the light that is directed to an interface between the light-permeable material 115 and the light shielding portion Z be able to occur total reflection and pass through the light-transmitting areas A2 of the display panel under a condition that a certain incident angle is met, and improves the amount of light that is directed to the inside of the display panel through the light-transmitting areas A2. The light transmission capacity of the light-transmitting areas A2 is further enhanced.

Optionally, the light-permeable material 115 is selected from transparent high-refractive materials such as zirconia.

Further, the cathode inhibition layer 113 includes a plurality of cathode inhibition portions disposed between the light-emitting units, and an orthographic projection area of light-permeable aperture projected on the cathode inhibition layer 113 is greater than or equal to an area of the cathode inhibition portion. Optionally, an orthographic projection shape of the light-permeable aperture projected on the cathode inhibition layer is same as a shape of a corresponding cathode inhibition portion. A distance between the orthographic projection of the light-permeable aperture projected on the light-emitting layer and an adjacent light-emitting unit ranges from 2 micrometers to 10 micrometers.

Further, an aperture size of the light-permeable aperture at a side close to the cathode inhibition layer 113 is smaller than an aperture size of the light-permeable aperture at a side away from the cathode inhibition layer 113. That is, the aperture size of the light-permeable aperture is gradually decreased from being away from the cathode inhibition layer 113 to close to the cathode inhibition layer, thereby forming a trapezoidal opening. The light-permeable apertures with the trapezoidal openings can increase light entering the light-transmitting areas A2 from the outside environment, thereby further improving the light-transmitting performance of the light-transmitting areas A2.

In this embodiment, the film structure of the normal display area 20 and the film structure of the normal display area shown in FIG. 4 may be same or different. When the film structure of the normal display area 20 of this embodiment is different from the film structure of the normal display area shown in FIG. 4, the difference in this embodiment is that the light shielding portion located between adjacent two color resists may be at least one of red color resist, green color resist, and blue color resist, and it is preferably blue color resist with darker brightness.

In view of above, the display panel provided by the embodiments of the present application includes: a cathode inhibition layer disposed on a side of the pixel definition layer and between light-emitting units, a cathode disposed on a side of a light-emitting layer away from a substrate, and a color filter layer disposed on the cathode away from the substrate, wherein a thickness of the cathode on the cathode inhibition layer is less than a thickness of the cathode on the light-emitting unit. The color filter layer includes a plurality of color resists corresponding to the light-emitting units, and a light shielding portion configured between two adjacent of the color resists, and the light shielding portion of the color filter layer includes a light-permeable aperture configured corresponding to the cathode inhibition layer, the light-permeable aperture filled with a light-permeable material, and a light transmittance of the light-permeable material in the light-permeable aperture is greater than a light transmittance of the light shielding portion. The embodiments of the present application increase the light transmittance in the area by providing the cathode inhibition layer between the light-emitting units to reduce the cathode thickness in the area. Moreover, a light-permeable aperture corresponding to the cathode inhibition layer is provided on the light shielding portion, and the light-permeable aperture is filled with a light-permeable material to further increase the light transmittance in the area between the light-emitting units, which increases the amount of light captured by the under-screen optical component and is conducive to improving the performance of the under-screen optical component.

The embodiments of the present application also provides a display device. The display device includes the display panel provided by the embodiments of the present application and optical components. The optical components are configured corresponding to the functional display area of the display panel and gather light through the light-transmitting area. The optical components may be cameras, optical sensors, or the like. The display devices may be mobile phones, tablet computers, or the like having display functions and under-screen camera functions.

It should be noted that although the application is disclosed the above with specific embodiments, the above-mentioned embodiments are not intended to limit the application, and those of ordinary skill in the art can make various modifications without departing from the spirit and scope of the application. Therefore, the protection scope of this application is subject to the scope defined by the claims.

What is claimed is:

1. A display panel, comprising: a normal display area and a functional display area, wherein the display panel comprises:
    a substrate, comprising a pixel definition layer defining a plurality of openings;
    a light-emitting layer disposed on a side of the substrate, the light-emitting layer comprising a plurality of light-emitting units corresponding to the openings;
    a cathode inhibition layer disposed on a side of the pixel definition layer, at least configured in the functional display area, and disposed between the light-emitting units;
    a cathode disposed on a side of the light-emitting layer away from the substrate, wherein a thickness of the cathode on the cathode inhibition layer is less than a thickness of the cathode on the light-emitting units; and
    a color filter layer disposed on a side of the cathode away from the substrate, the color filter layer comprising a plurality of color resists corresponding to the light-emitting units, and a light shielding portion configured between adjacent two of the color resists, the light shielding portion comprising a light-permeable aperture configured corresponding to the cathode inhibition layer, the light-permeable aperture filled with a light-permeable material, wherein a light transmittance of the light-permeable material is greater than a light transmittance of the light shielding portion;
    wherein the cathode inhibition layer comprises a plurality of cathode inhibition portions disposed between the light-emitting units, and an area of an orthographic projection of light-permeable aperture projected on the cathode inhibition layer is greater than or equal to an area of the cathode inhibition portion;

wherein a shape of the orthographic projection of the light-permeable aperture projected on the cathode inhibition layer is same as a shape of a corresponding cathode inhibition portion;

wherein an aperture size of the light-permeable aperture at a side close to the cathode inhibition layer is smaller than an aperture size of the light-permeable aperture at a side away from the cathode inhibition layer.

2. The display panel according to claim 1, wherein a distance between the orthographic projection of the light-permeable aperture projected on the light-emitting layer and adjacent one of the light-emitting units ranges from 2 micrometers to 10 micrometers.

3. The display panel according to claim 1, wherein the aperture size of the light-permeable aperture is gradually decreased from being far away the cathode inhibition layer to close to the cathode inhibition layer.

4. The display panel according to claim 1, wherein a refractive index of the light-permeable material is greater than a refractive index of the light shielding portion.

5. The display panel according to claim 4, wherein an angle between a side surface of the light-permeable aperture and a plane where the color filter layer is located is greater than or equal to 30 degrees and less than 90 degrees.

6. The display panel according to claim 4, wherein the color resist comprises a red color resist, a green color resist and a blue color resist, and the light shielding portion comprises a black color resist.

7. The display panel according to claim 4, wherein the color resist comprises a red color resist, a green color resist, and a blue color resist, and the light shielding portion comprises a blue color resist.

8. The display panel according to claim 1, wherein a thickness of the cathode on the cathode inhibition layer is zero.

9. The display panel according to claim 1, wherein a pixel density in the functional display area is less than or equal to a pixel density in the normal display area.

10. The display panel according to claim 1, wherein an area ratio of the cathode inhibition layer in the functional display area ranges 5% to 95%.

11. The display panel according to claim 1, wherein each of the light-emitting units comprises: an anode exposed through one of the openings, and a light-emitting function layer provided in the opening and in contact with the anode.

12. The display panel according to claim 1, wherein the display panel further comprises a thin-film encapsulation layer disposed between the color filter layer and the cathode.

13. The display panel according to claim 1, wherein an orthographic projection shape of the light-permeable aperture projected on the cathode inhibition layer comprises a shape of a circle, a rectangle, or a square.

14. The display panel according to claim 1, wherein the substrate further comprises: a base substrate, a semiconductor layer disposed on the base substrate, a gate insulating layer covering the semiconductor layer, a gate electrode disposed on the gate insulating layer, an interlayer insulating layer covering the gate electrode, a source electrode and a drain electrode disposed on the interlayer insulating layer, a planar layer covering the source electrode and the drain electrode, and the pixel definition layer disposed on the planar layer.

15. The display panel according to claim 1, wherein the cathode comprises a non-entire surface covering type electrode.

16. A display device, comprising the display panel according to claim 1, and an optical component arranged corresponding to the functional display area of the display panel.

17. A display panel, comprising: a normal display area and a functional display area, wherein the display panel comprises:
a substrate, comprising a pixel definition layer defining a plurality of openings;
a light-emitting layer disposed on a side of the substrate, the light-emitting layer comprising a plurality of light-emitting units corresponding to the openings;
a cathode inhibition layer disposed on a side of the pixel definition layer, at least configured in the functional display area, and disposed between the light-emitting units;
a cathode disposed on a side of the light-emitting layer away from the substrate, wherein a thickness of the cathode on the cathode inhibition layer is less than a thickness of the cathode on the light-emitting units; and
a color filter layer disposed on a side of the cathode away from the substrate, the color filter layer comprising a plurality of color resists corresponding to the light-emitting units, and a light shielding portion configured between adjacent two of the color resists, the light shielding portion comprising a light-permeable aperture configured corresponding to the cathode inhibition layer, the light-permeable aperture filled with a light-permeable material, wherein a light transmittance of the light-permeable material is greater than a light transmittance of the light shielding portion;
the color resist comprising a red resist, a green resist, and a blue resist, the light shielding portion comprising a blue resist, and a refractive index of the light-permeable material is greater than a refractive index of the light shielding portion;
wherein the cathode inhibition layer comprises a plurality of cathode inhibition portions disposed between the light-emitting units, and an area of an orthographic projection of light-permeable aperture projected on the cathode inhibition layer is greater than or equal to an area of the cathode inhibition portion;
wherein a shape of the orthographic projection of the light-permeable aperture projected on the cathode inhibition layer is same as a shape of a corresponding cathode inhibition portion;
wherein an aperture size of the light-permeable aperture at a side close to the cathode inhibition layer is smaller than an aperture size of the light-permeable aperture at a side away from the cathode inhibition layer.

18. A display panel, comprising: a normal display area and a functional display area, wherein the display panel comprises:
a substrate, comprising a pixel definition layer defining a plurality of openings;
a light-emitting layer disposed on a side of the substrate, the light-emitting layer comprising a plurality of light-emitting units corresponding to the openings;
a cathode inhibition layer disposed on a side of the pixel definition layer, at least configured in the functional display area, and disposed between the light-emitting units;
a cathode disposed on a side of the light-emitting layer away from the substrate, wherein a thickness of the cathode on the cathode inhibition layer is less than a thickness of the cathode on the light-emitting units; and
a color filter layer disposed on a side of the cathode away from the substrate, the color filter layer comprising a plurality of color resists corresponding to the light-emitting units, and a light shielding portion configured between adjacent two of the color resists, the light shielding portion comprising a light-permeable aperture configured corresponding to the cathode inhibition layer, the light-permeable aperture filled with a light-permeable material, wherein a light transmittance of the light-permeable material is greater than a light transmittance of the light shielding portion;

wherein an aperture size of the light-permeable aperture at a side close to the cathode inhibition layer is smaller than an aperture size of the light-permeable aperture at a side away from the cathode inhibition layer;

wherein the aperture size of the light-permeable aperture is gradually decreased from being far away the cathode inhibition layer to close to the cathode inhibition layer.

* * * * *